(12) United States Patent
Wang et al.

(10) Patent No.: US 12,112,944 B2
(45) Date of Patent: Oct. 8, 2024

(54) PREPARATION METHOD OF GaN FIELD EFFECT TRANSISTOR BASED ON DIAMOND SUBSTRATE

(71) Applicant: THE 13TH RESEARCH INSTITUTE OF CHINA ELECTRONICS TECHNOLOGY GROUP CORPORATION, Shijiazhuang (CN)

(72) Inventors: Yuangang Wang, Shijiazhuang (CN);
Shaobo Dun, Shijiazhuang (CN);
Yuanjie Lv, Shijiazhuang (CN);
Xingchang Fu, Shijiazhuang (CN);
Shixiong Liang, Shijiazhuang (CN);
Xubo Song, Shijiazhuang (CN);
Hongyu Guo, Shijiazhuang (CN);
Zhihong Feng, Shijiazhuang (CN)

(73) Assignee: The 13th Research Institute of China Electronics Technology Group Corporation, Shijiazhuang (CN)

( * ) Notice: Subject to any disclaimer, the term of this patent is extended or adjusted under 35 U.S.C. 154(b) by 431 days.

(21) Appl. No.: 17/728,643

(22) Filed: Apr. 25, 2022

(65) Prior Publication Data
US 2022/0254632 A1  Aug. 11, 2022

Related U.S. Application Data

(63) Continuation of application No. PCT/CN2021/141928, filed on Dec. 28, 2021.

(30) Foreign Application Priority Data

Feb. 5, 2021  (CN) .......................... 202110161018.X

(51) Int. Cl.
*H01L 21/02* (2006.01)
*H01L 29/16* (2006.01)
(Continued)

(52) U.S. Cl.
CPC .. *H01L 21/02458* (2013.01); *H01L 21/02376* (2013.01); *H01L 21/0254* (2013.01);
(Continued)

(58) Field of Classification Search
None
See application file for complete search history.

(56) References Cited

U.S. PATENT DOCUMENTS

2021/0320045 A1* 10/2021 Hwang ............... H01L 29/2003

FOREIGN PATENT DOCUMENTS

CN  104134689 A  11/2014
CN  107731903 A   2/2018
(Continued)

*Primary Examiner* — Feifei Yeung Lopez
(74) *Attorney, Agent, or Firm* — AP3 Law Firm PLLC

(57) ABSTRACT

The disclosure provides a preparation method of GaN field effect transistor based on diamond substrate, and relates to the technical field of semiconductor manufacturing. The method includes the following steps: preparing a GaN heterojunction layer on the front-side of a SiC substrate; thinning the SiC substrate; etching the SiC substrate; growing a diamond layer; removing a sacrificial layer and the diamond layer on the sacrificial layer; preparing a source electrode, a drain electrode and a gate electrode on the front surface of the GaN heterojunction layer; etching the SiC substrate and the GaN heterojunction layer to form a source through hole communicated with the source electrode; and removing the through hole mask layer, and preparing back grounding metal to complete the preparation of the diamond substrate GaN transistor device.

12 Claims, 1 Drawing Sheet

(51) Int. Cl.
   *H01L 29/20* (2006.01)
   *H01L 29/66* (2006.01)
   *H01L 29/778* (2006.01)

(52) U.S. Cl.
   CPC .... *H01L 21/02631* (2013.01); *H01L 29/1608* (2013.01); *H01L 29/2003* (2013.01); *H01L 29/66462* (2013.01); *H01L 29/7786* (2013.01)

(56) References Cited

FOREIGN PATENT DOCUMENTS

| | | |
|---|---|---|
| WO | 2020242494 A1 | 12/2020 |
| WO | 20200255259 A1 | 12/2020 |

* cited by examiner

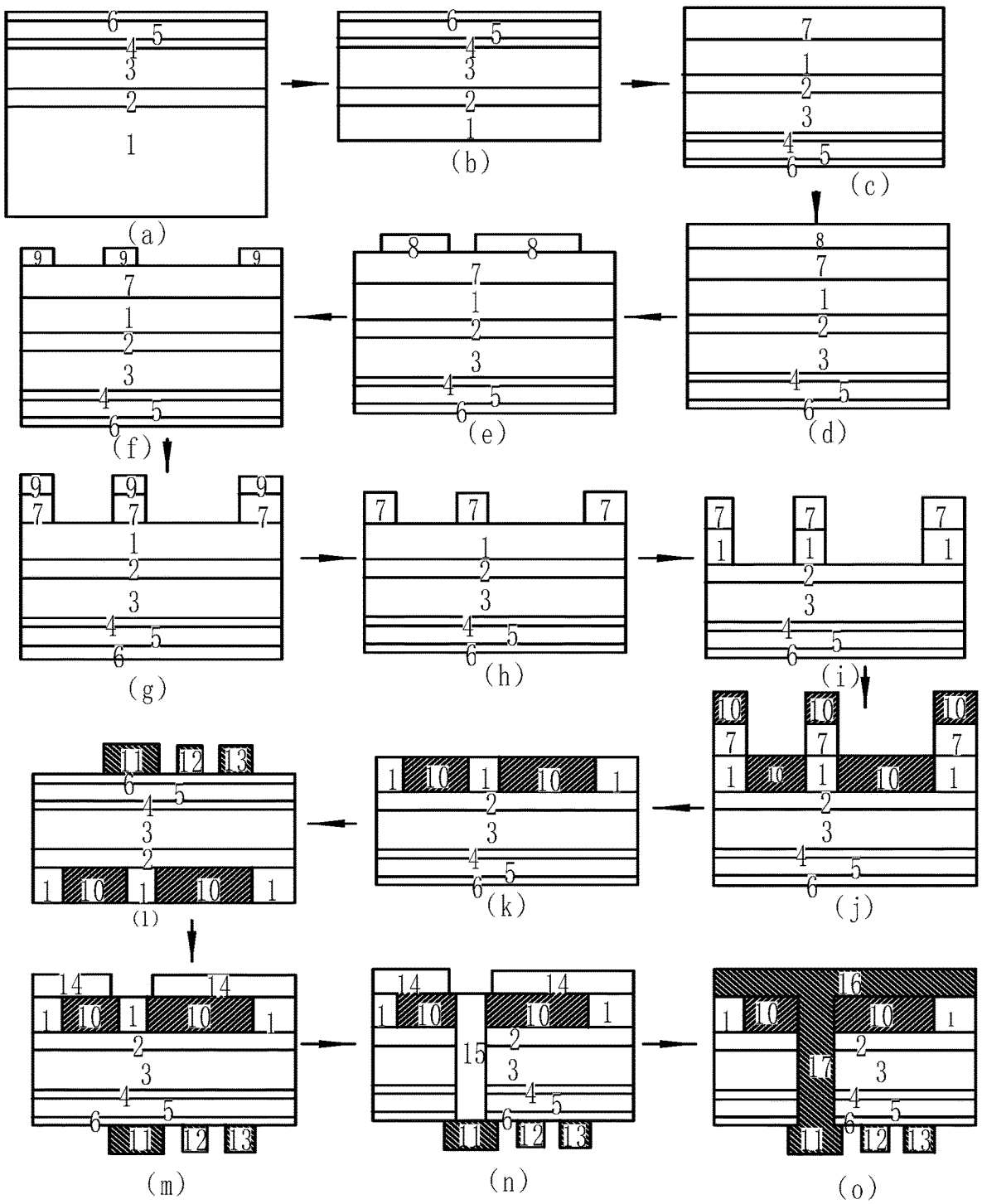

PREPARATION METHOD OF GaN FIELD EFFECT TRANSISTOR BASED ON DIAMOND SUBSTRATE

CROSS-REFERENCE TO RELATED APPLICATIONS

This application is a continuation of International Application No. PCT/CN2021/141928, filed on Dec. 28, 2021, which claims priority to Chinese Patent Application No. 202110161018.X, filed on Feb. 5, 2021. The disclosures of the aforementioned applications are hereby incorporated by reference in their entireties.

TECHNICAL FIELD

The disclosure relates to the technical field of semiconductor manufacturing, in particular to a preparation method of GaN field effect transistor based on diamond substrate.

BACKGROUND

In recent years, the technology of GaN (gallium nitride) transistors based on diamond substrates has gradually attracted the attention of scholars and industries at home and abroad. Compared with the current mainstream technology GaN transistor based on SiC (silicon carbide) substrate, this technology has potential applications in the field of high power and high frequency microwave. The high thermal conductivity of polycrystalline diamond substrates can significantly improve the thermal management capabilities of transistors, thereby increasing the power density of GaN-based RF (radio frequency) devices by a factor of three. At present, there are two main technical routes for the preparation of GaN transistors on diamond substrates. One is to epitaxially grow polycrystalline diamond on the backside after removing the backside SiC substrate. The second is to perform wafer-level bonding between the wafer removing the backside SiC substrate and the polycrystalline diamond. Then to make S (source), G (gate) and D (drain) metal electrodes on the front side of the GaN HEMT (High Electron Mobility Transistor) on diamond substrate, and make through holes and back electrodes to achieve source grounding. The GaN HEMT is a kind of the heterojunction GaN field effect transistor.

The current technical bottleneck of this method is: for the preparation of GaN HEMT based on the diamond substrate, firstly, due to the removal of the backside SiC substrate and the growth of diamond at high temperature, the deformation of the material is relatively large, which brings challenges to the subsequent front-side process; secondly, the diamond through hole process is difficult and immature.

SUMMARY

These and other problems are generally solved or circumvented, and technical advantages are generally achieved, by embodiments of the present disclosure which provide a preparation method of GaN field effect transistor based on diamond substrate.

Technical Problems

The disclosure aims to provide a preparation method of GaN field effect transistor based on diamond substrate to solve the problems that diamond etching is difficult, resulting in difficult and complex through-hole process.

Technical Solutions

To achieve the above purpose, the technical scheme adopted in the application is: a preparation method of GaN field effect transistor based on diamond substrate. The preparation method includes the following steps 1-15.

Step 1, preparing a GaN heterojunction layer on a front-side of a SiC substrate.

Step 2, thinning a backside of the SiC substrate to obtain a thinned SiC substrate.

Step 3, growing a sacrificial layer on a backside of the thinned SiC substrate.

Step 4, coating a photoresist on the sacrificial layer.

Step 5, exposing and developing the photoresist to form a metal mask area graphics on the sacrificial layer.

Step 6, evaporating and stripping a metal on the metal mask area graphics to form a metal mask layer on the metal mask area graphics.

Step 7, removing a part of the sacrificial layer that is outside an area covered by the metal mask layer to form a groove area on the sacrificial layer and to obtain a remaining sacrificial layer.

Step 8, removing the metal mask layer using a wet process.

Step 9, using the remaining sacrificial layer as a mask, and etching the thinned SiC substrate such that the groove area extends to a backside of the GaN heterojunction layer and to obtain a remaining SiC substrate.

Step 10, growing a diamond layer on the remaining sacrificial layer and the backside of the GaN heterojunction layer.

Step 11, removing a part of the diamond layer that covers the remaining sacrificial layer using the wet process to obtain a remaining diamond layer, and removing the remaining sacrificial layer using the wet process.

Step 12, preparing a source electrode, a drain electrode and a gate electrode on a front-side of the GaN heterojunction layer.

Step 13, preparing a through hole mask layer on the remaining diamond layer and the remaining SiC substrate.

Step 14, using the through hole mask layer as a mask, and etching the remaining SiC substrate and the GaN heterojunction layer to form a source through hole that is in communication with the source electrode.

Step 15, removing the through hole mask layer, and preparing a back grounding metal on the remaining diamond layer and on the remaining SiC substrate, to complete preparation of the GaN field effect transistor, the back grounding metal being in communication with the source through hole.

In one possible implementation, in the step 1, the GaN heterojunction layer includes a buffer layer, a channel layer and a barrier layer.

In one possible implementation, in the step 1, the GaN heterojunction layer includes a buffer layer, a channel layer, an insertion layer, a barrier layer and a cap layer, wherein the insertion layer is an AlN layer with a thickness of 1 nm~2 nm, and the cap layer is a GaN layer with a thickness of 2 nm~4 nm.

In one possible implementation, in the step 1, the barrier layer is an $Al_xGaN$ layer, $0<x\leq1$; or the barrier layer is an $In_xAlN$ layer, $0<x\leq1$; or the barrier layer is an $In_xAl_yGaN$ layer, $0\leq x<1$, $0<y\leq1$, $0\leq x+y\leq1$.

In one possible implementation, in the step 1, the buffer layer is an AlN layer, and the channel layer is a GaN layer.

In one possible implementation, in the step 2, a thickness of the SiC substrate is greater than 300 μm, and a thickness of the thinned SiC substrate is 1 μm~100 μm.

In one possible implementation, in the step 3, the sacrificial layer is a $SiO_2$ layer.

In one possible implementation, in the step 10, a thickness of the diamond layer is smaller than a sum of a thicknesses of the remaining sacrificial layer and a thicknesses of the thinned SiC substrate by at least 1 μm.

In one possible implementation, in the step 13, the through hole mask layer is a $SiO_2$ mask layer or a metal Ni mask layer.

In one possible implementation, in the step 15, a metalized through hole and the back grounding metal are formed using magnetron sputtering or electroplating.

Advantageous Effects of the Disclosure

Compared with the prior art, the preparation method of GaN field effect transistor based on diamond substrate provided by the present application, by retaining the SiC substrate in the through hole area and replacing the difficult diamond laser through hole process, the back through hole grounding on GaN heterojunction device based on diamond substrate is realized, which is convenient for the preparation of GaN HEMT device based on diamond substrate; and meanwhile, on the GaN HEMT wafer based on SiC substrate, SiC is only removed in a small area on the backside, which avoids large deformation of the material and provides convenience for the subsequent front-side process preparation.

BRIEF DESCRIPTION OF THE DRAWINGS

In order to more clearly illustrate the technical solutions in the embodiments of the present application, the embodiments or the drawings used in the prior art description will be briefly described below, and it is obvious that the drawings in the following description are only some embodiments of the present application, and that other drawings can be obtained from these drawings without involving any inventive effort for a person skilled in the art.

FIG. 1 is a schematic structural diagram of a preparation method of GaN field effect transistor based on diamond substrate according to an embodiment of the disclosure.

In the FIG. 1: 1. SiC substrate; 2. buffer layer; 3. channel layer; 4. insertion layer; 5. barrier layer; 6. cap layer; 7. sacrificial layer; 8. photoresist; 9. metal mask layer; 10. diamond layer; 11. source electrode; 12. drain electrode; 13. gate electrode; 14. through hole mask layer; 15. source through hole; 16. back grounding metal; 17. metalized through hole.

DETAILED DESCRIPTION OF ILLUSTRATIVE EMBODIMENTS

In order to make the technical problems to be solved, technical solutions and beneficial effects by the present application more clear, the present application will be further described in detail below with reference to the drawings and embodiments. It should be understood that the specific embodiments described herein are only used to explain the present application, but not to limit the present application.

Referring to FIG. 1, an embodiment preparation method of GaN field effect transistor based on diamond substrate provided by the application is described. The preparation method of GaN field effect transistor based on diamond substrate includes the following steps 1-15.

Step 1, with reference to FIG. 1(a), preparing a GaN heterojunction layer on a front-side of a SiC substrate 1.

Step 2, with reference to FIG. 1(b), thinning the SiC substrate 1; this step may thin a backside of the SiC substrate 1 to obtain a thinned SiC substrate 1.

Step 3, with reference to FIG. 1(c), growing a sacrificial layer 7 on a backside of the thinned SiC substrate 1.

Step 4, with reference to FIG. 1(d), coating a photoresist 8 on the sacrificial layer 7.

Step 5, with reference to FIG. 1(e), exposing and developing the photoresist 8 to form a metal mask area graphics on the sacrificial layer 7. It is apparent to those of ordinary skill in the art, that the metal mask area graphics is a pattern obtained by removing a part of the photoresist 8 after exposing and developing of the photoresist 8. This step may result in a remaining photoresist 8.

Step 6, with reference to FIG. 1(f), evaporating and stripping a metal on the metal mask area graphics to form a metal mask layer 9 on the metal mask area graphics. It is apparent to those of ordinary skill in the art, that by using the metal mask area graphics as a mask, and evaporating the required metal, while removing the remaining photoresist 8, the metal on the remaining photoresist 8 is also stripped off, leaving only the metal that is in direct contact with the sacrificial layer 7.

Step 7, with reference to FIG. 1(g), removing a part of the sacrificial layer 7 that is outside an area covered by the metal mask layer 9 to form a groove area on the sacrificial layer 7 and to obtain a remaining sacrificial layer 7.

Step 8, with reference to FIG. 1(h), removing the metal mask layer 9 using a wet process. It is apparent to those of ordinary skill in the art that the wet process refers to removal by wet etching. The wet etching is an etching method, which is a technique of immersing the structure to be etched in an etching solution for etching.

Step 9, with reference to FIG. 1(i), using the remaining sacrificial layer 7 as a mask, and etching the thinned SiC substrate 1 such that the groove area extends to a backside of the GaN heterojunction layer and to obtain a remaining SiC substrate 1. The remaining sacrificial layer 7 is obtained after removing the sacrificial layer 7 outside the area covered by the metal mask layer 9 on the original sacrificial layer 7 in the step 7.

Step 10, with reference to FIG. 1(j), growing a diamond layer 10 on the remaining sacrificial layer 7 and the backside of the GaN heterojunction layer.

Step 11, with reference to FIG. 1(k), removing a part of the diamond layer 10 that covers the remaining sacrificial layer 7 using the wet process to obtain a remaining diamond layer 10, and removing the remaining sacrificial layer 7 using the wet process. It is apparent to those of ordinary skill in the art that the wet process refers to removal by wet etching as described above.

Step 12, with reference to FIG. 1(l), preparing (or making, or creating) a source electrode 11, a drain electrode 13 and a gate electrode 12 on a front-side of the GaN heterojunction layer.

Step 13, with reference to FIG. 1(m), preparing (or making, or creating) a through hole mask layer 14 on the remaining diamond layer 10 and the remaining SiC substrate 1. The remaining SiC substrate 1 is obtained after etching on the thinned SiC substrate 1 in the step 9.

Step 14, with reference to FIG. 1(n), using the through hole mask layer 14 as a mask, and etching the remaining SiC substrate 1 and the GaN heterojunction layer to form a source through hole 15 that is in communication with the source electrode 11.

Step 15, with reference to FIG. 1(o), removing the through hole mask layer 14, and preparing a back grounding metal 16 on the remaining diamond layer 10 and on the remaining SiC substrate 1, to complete preparation of the GaN field effect transistor based on the diamond substrate, the back grounding metal being in communication with the source through hole 15. The back grounding metal 16 is formed on the backside of the substrate and is used for connecting with the source electrode to realize the grounding effect of the source electrode 11. The diamond substrate is formed by the SiC substrate 1 and diamond layer 10.

It can be understood that in the above steps, the operation object of the latter step is the operation object obtained by executing the previous corresponding step.

It is apparent to those of ordinary skill in the art that the front-side and the backside are two opposite sides. As an example, if one side of a layer or substrate is used as the front-side, and then the other side (opposite to the front-side) of the layer or substrate is used as the backside. The direction represented by the front-side of a layer is generally used to prepare the source electrode, the gate electrode and the drain electrode.

Compared with the prior art, the preparation method of GaN field effect transistor based on diamond substrate provided by the present application, by retaining the SiC substrate in the through hole area and replacing the difficult diamond laser through hole process, the back through hole grounding on GaN heterojunction device based on diamond substrate is realized, which is convenient for the preparation of GaN HEMT device based on diamond substrate; and meanwhile, on the GaN HEMT wafer based on SiC substrate, SiC is only removed in a small area on the backside, which avoids large deformation of the material and provides convenience for the subsequent front-side process preparation.

In some possible embodiments, with reference to FIG. 1(a), in the step 1, the GaN heterojunction layer includes a buffer layer 2, a channel layer 3 and a barrier layer 5.

In other possible embodiments, with reference to FIG. 1(a), in the step 1, the GaN heterojunction layer includes a buffer layer 2, a channel layer 3, an insertion layer 4, a barrier layer 5 and a cap layer 6, wherein the insertion layer 4 is an AlN (aluminum nitride) layer with a thickness of 1 nm~2 nm, and the cap layer 6 is a GaN layer with a thickness of 2 nm~4 nm. Understandably, the numerical range of the insertion layer 4 and the cap layer 6 refers to the thickness and may be any value within the above numerical range. Of course, the GaN heterojunction layer may also include other layer structures, and the layer structure thickness may also be in other ranges, not limited to this.

In one embodiment, with reference to FIG. 1(a), in the step 1, the barrier layer 5 is an $Al_xGaN$ (aluminum gallium nitride) layer, $0<x\leq1$, and the preferred range is $0.15\leq x\leq0.4$; or the barrier layer 5 is an $In_xAlN$ (indium aluminum nitride) layer, $0<x\leq1$, and the preferred range is $0.13\leq x\leq0.25$; or the barrier layer 5 is an $In_xAl_yGaN$ (indium aluminum gallium nitride) layer, $0\leq x<1$, $0<y\leq1$, $0\leq x+y\leq1$. Understandably, the value of the barrier layer 5 may be any value within the above numerical range. Of course, the barrier layer 5 may also be other materials and other values.

In one embodiment, with reference to FIG. 1(a), in the step 1, the buffer layer 2 is an AlN layer, and the channel layer 3 is a GaN layer.

In some possible embodiments, in the step 2, with reference to FIG. 1(b), a thickness of the SiC substrate 1 is greater than 300 μm, and a thickness of the thinned SiC substrate 1 is 1 μm~100 μm. Understandably, the thickness of the SiC substrate 1 greater than 300 μm refers to the initial thickness of the original, unthinned SiC substrate 1. The above thickness may be any value within the above numerical range. Of course, it may also be other values.

In some possible embodiments, in the step 3, with reference to FIG. 1(c), the sacrificial layer 7 is a $SiO_2$ layer. The sacrificial layer 7 is the final structure to be removed. When depositing the diamond layer 10, the diamond will evenly cover the surface of the SiC substrate 1. If the diamond is directly deposited on the SiC substrate 1, it will be difficult to remove the diamond at the hole forming position. The purpose of setting the sacrificial layer 7 is to remove the diamond layer 10 deposited on the sacrificial layer 7 at the hole forming position. Thus, the diamond layer 10 deposited on the corresponding hole position of the SiC substrate 1 may be removed, so that the SiC substrate 1 may be removed using dry etching or wet etching to form a hole.

In some possible embodiments, in the step 7, with reference to FIG. 1(g), the sacrificial layer 7 outside the area covered by the metal mask layer 9 is removed using dry etching, or dry etching combined with wet etching.

In some possible embodiments, in the step 9, with reference to FIG. 1(i), this technology uses ICP (Inductively Coupled Plasma Etching) to etch part of SiC substrate 1. The control accuracy of ICP is higher than that of mechanical grinding process that completely removes the backside SiC substrate 1. It is easy to form fragments when removing SiC substrate 1 using mechanical grinding process, and the time to completely remove the SiC substrate 1 is not easy to control.

In some possible embodiments, in the step 10, with reference to FIG. 1(j), a thickness of the diamond layer 10 is smaller than a sum of a thicknesses of the remaining sacrificial layer 7 and a thicknesses of the thinned SiC substrate 1 by at least 1 μm. For example, the thickness of the diamond layer 10 may be lower than the thickness of the thinned SiC substrate 1 or higher than the thickness of the thinned SiC substrate 1, but less than the sum of the thickness of the remaining sacrificial layer 7 and the thinned SiC substrate 1, so as to remove the diamond layer 10 located on the sacrificial layer 7 and to remove the sacrificial layer 7. Of course, the thickness of the diamond layer 10 may also be other values.

In some possible embodiments, in the step 12, with reference to FIG. 1(l), the prepared source electrode 11, drain electrode 13 and gate electrode 12 are the most basic structures of the transistor device, and may also be optimized based on the passivation layer and the field plate structure based on the structure. The passivation layer and field plate structure may also be optimized based on the basic structures.

In some possible embodiments, in the step 13, with reference to FIG. 1(m), the through hole mask layer 14 is a $SiO_2$ mask layer or a metal Ni mask layer. Wherein, the preparation process of the through hole mask layer 14 is similar to that of the metal mask layer 9, and will not be repeated here. The growth method of the $SiO_2$ mask layer may be PECVD (Plasma Enhanced Chemical Vapor Deposition) or LPCVD (Low Pressure Chemical Vapor Deposition), and the thickness of the $SiO_2$ mask layer ranges from 10 um to 1000 um. The preparation method of the metal Ni mask layer may be electron beam evaporation, magnetron sputtering evaporation or electroplating. The area of the source through hole 15 is exposed by photolithography, and then the SiO₂ mask layer and the metal Ni mask layer are etched away using ICP to prepare for etching the SiC substrate 1 to form the source through hole 15.

In some possible embodiments, in the step 14, the SiC substrate 1 and the GaN heterojunction layer are etched by ICP to form a source through hole 15.

In some possible embodiments, in the step 15, with reference to FIG. 1(o), a metalized through hole 17 and the back grounding metal 16 are formed using magnetron sputtering or electroplating.

The above mentioned embodiments are only preferred embodiments of this application, but not to limit this disclosure. Any modification, equivalent replacement and improvement made within the spirit and principles of this application should be included in the scope of protection of this application.

What is claimed is:

1. A preparation method of a gallium nitride (GaN) field effect transistor, comprising following steps:
    step 1, preparing a GaN heterojunction layer on a front-side of a silicon carbide (SiC) substrate;
    step 2, thinning a backside of the SiC substrate to obtain a thinned SiC substrate;
    step 3, growing a sacrificial layer on a backside of the thinned SiC substrate;
    step 4, coating a photoresist on the sacrificial layer;
    step 5, exposing and developing the photoresist to form a metal mask area graphics on the sacrificial layer;
    step 6, evaporating and stripping a metal on the metal mask area graphics to form a metal mask layer on the metal mask area graphics;
    step 7, removing a part of the sacrificial layer that is outside an area covered by the metal mask layer to form a groove area on the sacrificial layer and to obtain a remaining sacrificial layer;
    step 8, removing the metal mask layer using a wet process;
    step 9, using the remaining sacrificial layer as a mask, and etching the thinned SiC substrate such that the groove area extends to a backside of the GaN heterojunction layer and to obtain a remaining SiC substrate;
    step 10, growing a diamond layer on the remaining sacrificial layer and the backside of the GaN heterojunction layer;
    step 11, removing a part of the diamond layer that covers the remaining sacrificial layer using the wet process to obtain a remaining diamond layer, and removing the remaining sacrificial layer using the wet process;
    step 12, preparing a source electrode, a drain electrode and a gate electrode on a front-side of the GaN heterojunction layer;
    step 13, preparing a through hole mask layer on the remaining diamond layer and the remaining SiC substrate;
    step 14, using the through hole mask layer as a mask, and etching the remaining SiC substrate and the GaN heterojunction layer to form a source through hole that is in communication with the source electrode; and
    step 15, removing the through hole mask layer, and preparing a back grounding metal on the remaining diamond layer and the remaining SiC substrate, to complete preparation of the GaN field effect transistor, the back grounding metal being in communication with the source through hole.

2. The method according to claim 1, wherein in the step 1, the GaN heterojunction layer comprises a buffer layer, a channel layer and a barrier layer.

3. The method according to claim 2, wherein in the step 1, the barrier layer is an Al$_x$GaN layer, $0<x\leq1$; or the barrier layer is an In$_x$AlN layer, $0<x\leq1$; or the barrier layer is an In$_x$Al$_y$GaN layer, $0\leq x<1$, $0<y\leq1$, $0\leq x+y\leq1$.

4. The method according to claim 2, wherein in the step 1, the buffer layer is an AlN layer, and the channel layer is a GaN layer.

5. The method according to claim 1, wherein in the step 1, the GaN heterojunction layer comprises a buffer layer, a channel layer, an insertion layer, a barrier layer and a cap layer, wherein the insertion layer is an AlN layer with a thickness of 1 nm~2 nm, and the cap layer is a GaN layer with a thickness of 2 nm~4 nm.

6. The method according to claim 5, wherein in the step 1, the barrier layer is an Al$_x$GaN layer, $0<x\leq1$; or the barrier layer is an In$_x$AlN layer, $0<x<1$; or the barrier layer is an In$_x$Al$_y$GaN layer, $0\leq x<1$, $0<y\leq1$, $0\leq x+y\leq1$.

7. The method according to claim 5, wherein in the step 1, the buffer layer is an AlN layer, and the channel layer is a GaN layer.

8. The method according to claim 1, wherein in the step 2, a thickness of the SiC substrate is greater than 300 μm, and a thickness of the thinned SiC substrate is 1 μm~100 μm.

9. The method according to claim 1, wherein in the step 3, the sacrificial layer is a SiO₂ layer.

10. The method according to claim 1, wherein in the step 10, a thickness of the diamond layer is smaller than a sum of a thicknesses of the remaining sacrificial layer and a thicknesses of the thinned SiC substrate by at least 1 μm.

11. The method according to claim 1, wherein in the step 13, the through hole mask layer is a SiO₂ mask layer or a metal Ni mask layer.

12. The method according to claim 1, wherein in the step 15, a metalized through hole and the back grounding metal are formed using magnetron sputtering or electroplating.

* * * * *